United States Patent [19]

Valley

[11] Patent Number: 4,914,357

[45] Date of Patent: Apr. 3, 1990

[54] TEMPERATURE COMPENSATED FOLDBACK CURRENT LIMITING

[75] Inventor: Richard L. Valley, Nashua, N.H.

[73] Assignee: Unitrode Corporation, Lexington, Mass.

[21] Appl. No.: 172,009

[22] Filed: Mar. 23, 1988

[51] Int. Cl.⁴ .......... H03K 5/08

[52] U.S. Cl. .......... 315/309; 307/540; 307/562

[58] Field of Search .......... 315/291, 309; 307/540, 307/557, 562, 564

[56] References Cited

U.S. PATENT DOCUMENTS

| | | | |
|---|---|---|---|
| 3,947,751 | 3/1976 | Bray | 307/542 X |
| 4,533,845 | 5/1985 | Bynum | 307/540 |
| 4,727,269 | 2/1988 | Luich | 307/553 X |

*Primary Examiner*—David Mis

*Attorney, Agent, or Firm*—Weingarten, Schurgin, Gagnebin & Hayes

[57] ABSTRACT

A current-limiting circuit providing a foldback limiting action which is compensated for the temperature coefficient of the sensing resistor. Temperature compensation and voltage-related signals are combined with a multiplier circuit providing a multiplier output which is compared to the voltage developed across the sense resistor to produce a current control or current limiting indicating signal. One embodiment of the present invention is implemented in a monolithic integrated circuit including an aluminum sense resistor, and the temperature compensation selected to substantially eliminate the effects of the temperature coefficient of the aluminum sense resistor, resulting in a more stable foldback current limiting characteristic over an extended temperature range.

8 Claims, 1 Drawing Sheet

TEMPERATURE COMPENSATED FOLDBACK CURRENT LIMITING

FIELD OF THE INVENTION

The present invention relates to current limiting circuits and, in particular, temperature compensated current limiting circuits providing a foldback current limiting characteristic.

BACKGROUND OF THE INVENTION

To sense high level currents (>1A) on an integrated circuit (IC) control device requires the use of a resistor of a very low value, e.g., 100 milliohms to prevent excessive sense voltages and/or power dissipation. Commonly used resistors include emitter resistors and metal resistors. Both of these resistor types suffer from a temperature coefficient of the resistance. Because of its very low sheet resistance, the metal resistor has a distinct advantage when large currents are to be sensed. However, aluminum has a temperature coefficient (TC) of resistance of about 3300 ppm/°C. This TC is enough to cause a variation in the value of a resistor of about 60% for the military temperature range of −55° to 125° C.

SUMMARY OF THE INVENTION

This invention provides a current control signal by a combination of a temperature compensation signal with an additional signal that is proportional to the output voltage of a linear regultor to achieve, with an internal current sense resistor, a foldback current limiting characteristic that is stable over an extended temperature range. The temperature compensation and output voltage related signals are combined using a multiplier circuit having a multiplier output control signal that provides a variable reference voltage. The variable reference voltage is compared to the voltage developed across the internal current sense resistor to provide a current limit/indicator control output signal, which when received by an external current control circuit, provides the desired foldback current limiting. With the above technique this variation in the current limit/indicator control output signal from change in temperature over the range −55° to +125° C. is easily held to less than 10%, allowing a much tighter device specification on current control.

BRIEF DESCRIPTION OF THE DRAWING

These and other features of the present invention will be further understood by reading the following detailed description, taken together with the drawing, wherein.

DETAILED DESCRIPTION OF THE INVENTION

Figure 1:
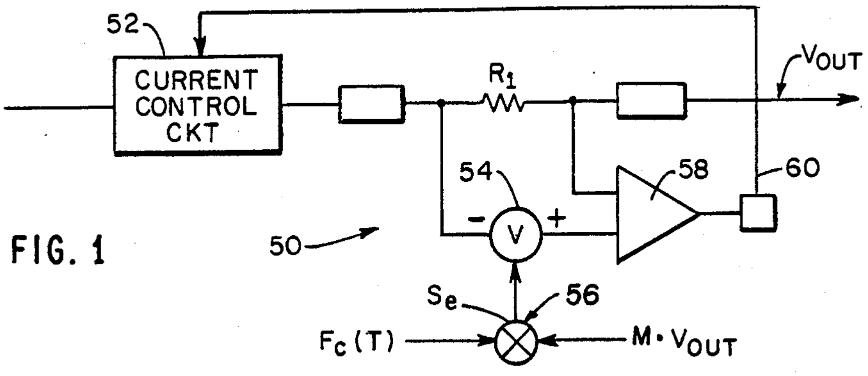
FIG. 1 is a block diagram of one embodiment of the present invention.

A general block diagram 50 of one embodiment of the present invention is shown in FIG. 1, wherein a flow of current, typically from a power supply is provided into a current control circuit 52 having an output voltage $V_{out}$ which is monitored by a series current monitoring resistor $R_1$. As increasing load current, a voltage is produced across $R_1$. Simultaneously, the circuit according to the present invention provides a temperature compensated variable voltage source 54 which, in response to the product of a temperature coefficient signal and the output voltage $V_{out}$ related signal from multiplier 56, provides adjustment of the variable voltage source 54. The voltage developed across the current sensing resistor is compared to the variable reference voltage (produced by the source 54) by the amplifier 58, which when operated in a linear mode provides a continuously variable signal at 60 according to the difference of the two voltages. Alternately, the amplifier 58 could be operated in a two-state mode as a comparator such that the output signal 60 has a binary or two-state position. The current control circuit 52 in response to the signal on lead 60 adjusts or limits the current provided through $R_1$. Alternate embodiments provide the current control circuit subsequent to the resistance $R_1$ in the circuit.

Figure 2:
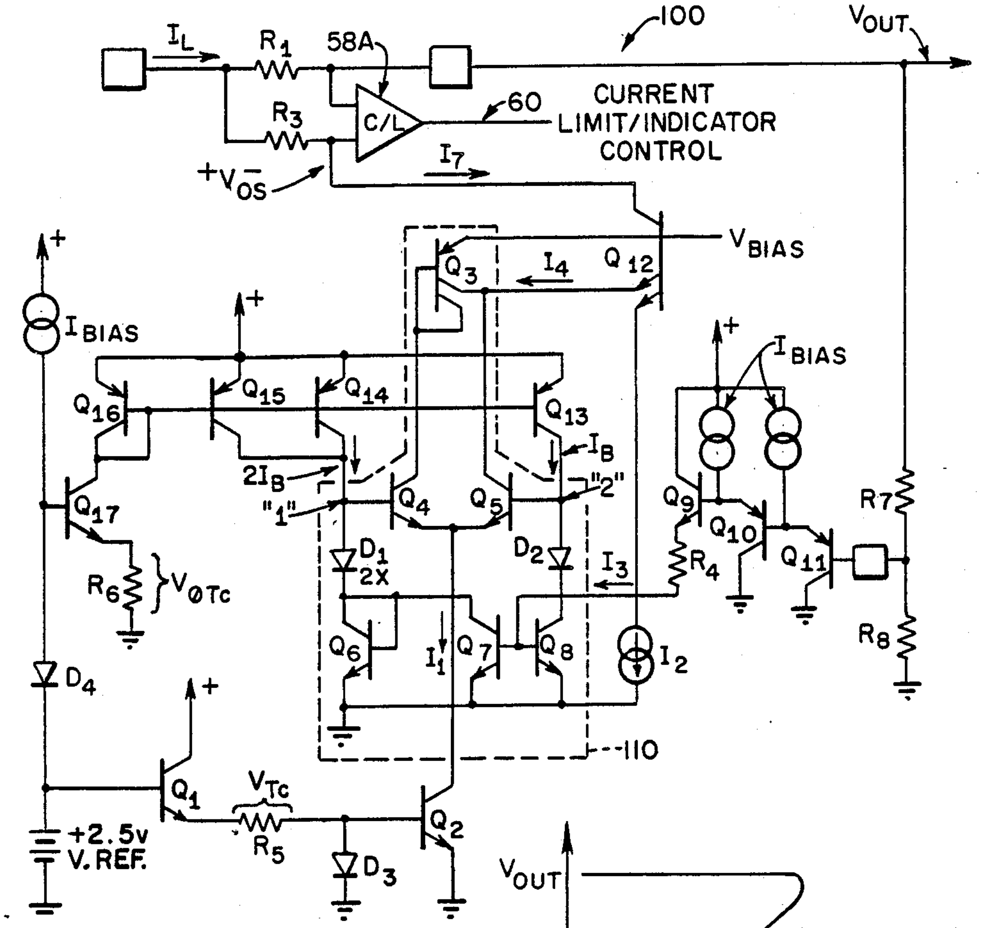
FIG. 2 is a more detailed schematic diagram of the embodiment in FIG. 1.
Figure 3:
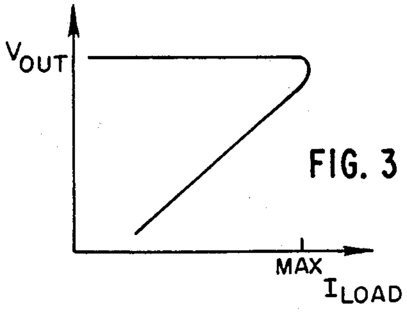
FIG. 3 is a graph of typical desired current limiting characteristics achieved by the circuit of the embodiments shown in FIGS. 1 and 2.

In FIG. 2 a simplified schematic 100 of a realization of this technique is shown. The present invention provides a control signal at 60 that limits the sensed current $I_L$ to levels that vary as a function of the output voltage $V_{out}$ of the regulator in which this circuit is used. FIG. 3 shows the desired current limiting characteristics that is achieved by one embodiment of the present invention. The foldback is provided by the $V_{out}$ dependence of voltage source 54.

Referring to FIG. 2, an offset voltage across $R_3$ is developed by current $I_7$ that creates an offset voltage at the input to amplifier 58A. When the sensed current, $I_L$, creates an equal or larger voltage across the internal sense resistor, $R_1$, then the amplifier 58A will respond with a signal at 60 that is used to control the current $I_L$ by a current limiter, which can include the pass element in a linear regulator. In this circuit current $I_7$ is derived from a multiplier circuit 110 composed of Q3–Q8, $D_1$, $D_2$, and current inputs $I_B$, $I_1$ and $I_3$. In addition, current $I_2$ is added into $I_7$ providing a minimum level for $I_7$. The output of the multiplier is current $I_4$. The level of this current is given by equation 1.

$$I_4=(I_3*I_1)/I_B \quad (1)$$

$I_3$ is shown as a variable source, this source is realized by sensing the output voltage of the regulator and internally applying this voltage across a resistor such that it has the following form:

$$I_3=M*V_{out}/R_4 \quad (2)$$

where $V_{out}$ is the sensed output voltage, M is $R_8/(R_7+R_8)$ and $R_4$ is a internal resistor. The base-emitter voltage drops of transistors $Q_{10}$ and $Q_{11}$ cancel the voltage drops across the base-emitter junctions of transistors $Q_8$ and $Q_9$.

Current source $I_1$ is derived from a internally generated voltage source, $V_{TC}$, and internal resistor $R_5$. Current source $I_2$ is derived as a ratio, K, of current $I_1$, according to equation 3.

$$I_1=V_{TC}/R_5 \quad (3)$$

$$I_2=K*I_1 \quad (4)$$

where K is a selected minimum portion current for a zero volt output foldback typically 0.1–0.3 of maximum current (=1).

Voltage source $V_{TC}$ is a temperature dependent source with a temperature coefficient that tracks that of the current sense resistor $R_1$. $V_{TC}$ is $V_{REF}$ less the two $V_{BE}$ voltages of $Q_1$ and $Q_2$. $V_{REF}$ is 2.5 V and constant over changes in temperature. The resulting value and temperature coefficient of $V_{TC}$ is 1.2 V and +4 mV/°C. or +3333 ppm/°C., respectively. An aluminum resistor is used for $R_1$ in this embodiment, having a temperature coefficient of about 3300 ppm/°C. in this embodiment.

The third current from equation 1, $I_B$, is derived from a zero TC internal source, $V_{OTC}$ and internal resistor $R_6$, as shown in equation 5.

$$I_B = V_{OTC}/R_6 \quad (5)$$

$V_{REF}$ is used for $V_{OTC}$ and the junction voltage drops across $D_4$ and $Q_{17}$ cancel.

From the proceeding we can write the equation for $I_4$ as:

$$I_4 = (M^*V_{out}^*V_{TC}/V_{OTC})^*R_6/(R_4^*R_5) \quad (6)$$

The resulting current threshold of the overall circuit can be written as $$I_L = [(V_{TC}/R_1)^*(R_3/R_5)][(M^*V_{out}/V_{OTC})^*(R_6/R_4)+K] \quad (7)$$

From equation 6 it is understood that by generating a $V_{TC}$ whose value temperature tracks that of the sensing resistor, $R_1$, the overall expression for $I_L$ can be made stable over temperature. The remaining portions of the expression contain the zero TC voltage, $V_{OTC}$, and the resistor ratios, all easily made temperature independent.

Modifications and substitutions made by those of skill in the art are included within the scope of the present invention which is not to be limited except by the claims which follow. Moreover, the present invention may be adapted to different circuit embodiments and implementations. The current source elements in FIG. 2, labeled $I_{bias}$ comprise constant current sources which provide sufficient current to turn on the circuits connected thereto, and are typically limited by the design conventions of the integrated circuit in which the embodiment is found. Typical range of bias currents contemplated within the range of tens of microamperes to tens of milliamperes, although greater or lesser currents may be provided in circuits which warrant such adjustments. Similarly, bias voltage, labeled $V_{bias}$, is a substantially constant bias voltage of sufficient magnitude to permit the circuits connected thereto to be functional according to the teaching of the present invention. Moreover, in an embodiment of the present invention which is entirely fabricated on a single monolithic integrated circuit, the typical range of bias voltages lie within the range of 1.5 volts to 30 volts, with a greater or lesser value being contemplated in circuits which have the semiconductor implementation selected accordingly.

What is claimed is:

1. Current limit apparatus, comprising:

a sensing resistor receiving a flow of current therethrough and having a resistance temperature coefficient;

means for providing a temperature responsive signal;

means for providing a variable reference voltage according to at least said temperature responsive signal; and means for providing a current limit control signal corresponding to the difference of the voltage developed across said sensing resistor and said variable reference voltage, wherein said temperature responsive signal provides a change in said variable reference voltage to compensate for temperature induced change in the voltage across said sensing resistor according to said sensing resistance temperature coefficient.

2. The current limit apparatus of claim 1, wherein said means for providing a variable reference voltage includes:

a first resistor; and a controlled current source connected to said first resistor and being responsive to said temperature responsive signal.

3. The current limit apparatus of claim 2, wherein said means for providing a variable reference voltage is further responsive to the magnitude of the voltage at the load side of said sensing resistor.

4. The current limit apparatus of claim 3, wherein said means for providing a variable reference voltage further includes multiplier means receiving said temperature responsive voltage signal and a signal proportional to the magnitude of the voltage at the load side of said sensing resistor, providing a multiplier output signal to which said controlled current source is responsive.

5. The current limit apparatus of claim 2, further including:

current control means connected in series with said flow of current for limiting the flow of current in response to said current limit control signal.

6. The current limit apparatus of claim 1, wherein said current control signal is a continuously variable signal having a magnitude related to the relative difference between the voltage developed across said sensing resistor and said variable reference voltage.

7. The current limit apparatus of claim 1, wherein said current control signal has a first state and a second state depending on which of the voltage across said sensing resistor and said variable reference voltage is larger.

8. The current limit apparatus of claim 1, wherein all elements thereof comprise a monolithic integrated circuit.

* * * * *